United States Patent
Tanzawa

(10) Patent No.: US 9,727,417 B2
(45) Date of Patent: Aug. 8, 2017

(54) CHUNK REDUNDANCY ARCHITECTURE FOR MEMORY

(75) Inventor: Toru Tanzawa, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 495 days.

(21) Appl. No.: 13/995,169

(22) PCT Filed: Mar. 29, 2012

(86) PCT No.: PCT/US2012/031247
§ 371 (c)(1),
(2), (4) Date: Jun. 17, 2013

(87) PCT Pub. No.: WO2013/147800
PCT Pub. Date: Oct. 3, 2013

(65) Prior Publication Data
US 2013/0332674 A1    Dec. 12, 2013

(51) Int. Cl.
*G06F 11/10* (2006.01)
*G06F 3/06* (2006.01)
*G11C 29/00* (2006.01)

(52) U.S. Cl.
CPC ........ *G06F 11/1076* (2013.01); *G06F 3/0689* (2013.01); *G11C 29/82* (2013.01)

(58) Field of Classification Search
CPC ........... G11C 5/02; G11C 5/025; G11C 5/063; G11C 7/18; G11C 29/70; G11C 29/76; G11C 29/78; G11C 29/785; G11C 29/82; G06F 11/1076; G06F 3/0689
See application file for complete search history.

(56) References Cited

U.S. PATENT DOCUMENTS

| | | | | |
|---|---|---|---|---|
| 5,200,959 A | * | 4/1993 | Gross | ............ G11C 29/765 714/6.13 |
| 5,479,609 A | * | 12/1995 | Hsu | ............ G06F 3/0601 714/6.13 |
| 6,172,933 B1 | | 1/2001 | Sager | |
| 6,757,852 B1 | | 6/2004 | Ghassemi et al. | |
| 7,362,628 B2 | | 4/2008 | Takenaka | |

(Continued)

FOREIGN PATENT DOCUMENTS

JP    2008-016183 A    1/2008
WO    2013/147800 A1   10/2013

OTHER PUBLICATIONS

International Search Report and Written opinion for PCT Patent Application No. PCT/US2012/031247, mailed on Nov. 28, 2012, 9 Pages.

(Continued)

*Primary Examiner* — Rocio Del Mar Perez-Velez
(74) *Attorney, Agent, or Firm* — Compass IP Law PC

(57) ABSTRACT

An integrated circuit (IC) includes addressable blocks of memory, and at least one redundant block of memory. A block of memory includes two or more chunks of memory. The IC also includes redundancy control cells. Control circuitry is included to access a first chunk of a redundant block of memory in place of a first remapped chunk one of the addressable blocks of memory, and a second chunk of a redundant block of memory in place of a second remapped chunk one of the addressable blocks of memory, based on the redundancy control cells.

16 Claims, 8 Drawing Sheets

(56) References Cited

U.S. PATENT DOCUMENTS

| | | | |
|---|---|---|---|
| 7,743,303 B2* | 6/2010 | Nobunaga | G11C 29/76 714/6.13 |
| 2005/0232012 A1* | 10/2005 | Park | G11C 16/0483 365/185.17 |
| 2007/0103977 A1* | 5/2007 | Conley | G11C 16/0483 365/185.09 |
| 2009/0282301 A1 | 11/2009 | Flynn et al. | |
| 2010/0124132 A1* | 5/2010 | Sarin | G11C 29/848 365/200 |
| 2011/0078363 A1* | 3/2011 | Yeh | G06F 12/0246 711/103 |
| 2011/0147824 A1 | 6/2011 | Son et al. | |
| 2012/0084611 A1* | 4/2012 | Flynn | G06F 11/006 714/723 |
| 2012/0267701 A1* | 10/2012 | Chae | H01L 27/1157 257/324 |
| 2015/0262636 A1* | 9/2015 | Tanzawa | G11C 16/06 365/189.05 |

OTHER PUBLICATIONS

International Preliminary Report on Patentability received for International Application No. PCT/US2012/031247, mailed on Oct. 9, 2014.

English Translation of Search Report of R.O.C. Patent Application No. 102106681, dated Apr. 7, 2017, 1 page.

English Translation of Taiwan Office Action, Patent Application No. 10206681, dated Jun. 5, 2017, 7 pages.

* cited by examiner

CHUNK REDUNDANCY ARCHITECTURE FOR MEMORY

BACKGROUND

Technical Field

The present subject matter generally relates to semiconductor integrated circuits, and more particularly, to an architecture for redundant memory cells in memory devices, including memory devices utilizing three-dimensional circuit techniques.

Background Art

Some integrated circuits (ICs), including dedicated memory devices, include blocks of memory cells. While traditional memory devices organize the cells in a two dimensional array, some devices may include a three dimensional array of cells. In some three dimensional flash memories, a NAND string may be built vertically, stacking the individual field-effect transistors (FETs) of the string on top of each other, so that the string extends out from the substrate. Such architectures may provide for very high bit densities in a flash memory device. A side-effect of these large three dimensional structures is that since the number of defects may be proportional to the total area of the various layers and a three dimensional memory may have many layers, the total area that may contain a defect is much larger than a similarly sized two dimensional array, leading to a lower yield in manufacturing.

Redundant memory cells have been used to improve yields. In some architectures, additional memory cells have been provided to implement error correction codes, such as hamming codes, to correct single bit errors, or even multi-bit errors, in a word or other sized parallel access of the memory array. Other architectures have included redundant rows or columns of the memory array that could be mapped to replace a complete row or column that is found to be defective.

BRIEF DESCRIPTION OF THE DRAWINGS

The accompanying drawings, which are incorporated in and constitute part of the specification, illustrate various embodiments. Together with the general description, the drawings serve to explain different principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1A:
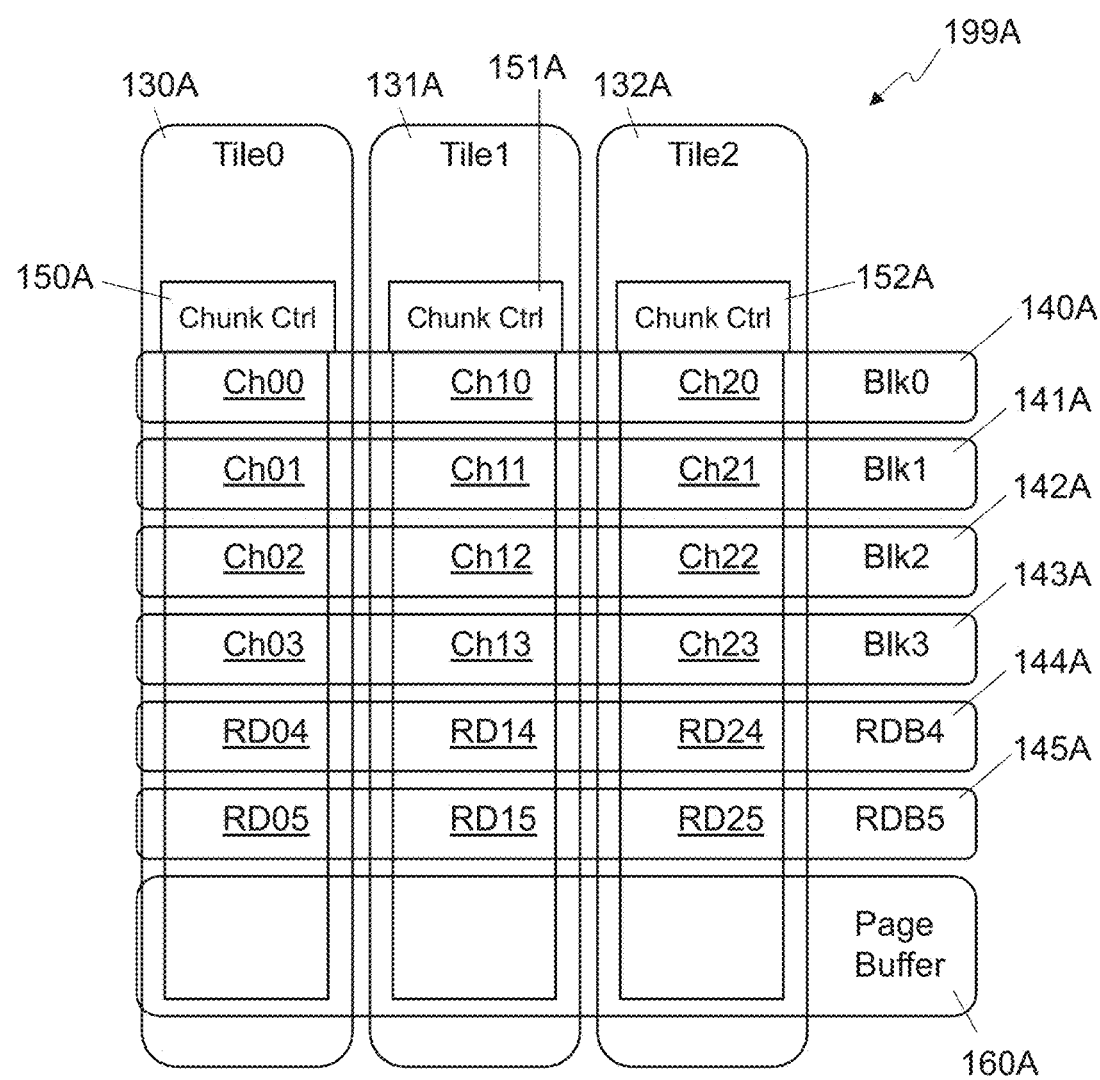
FIG. 1A is a high level block diagram of an embodiment of a memory array with a chunk redundancy architecture.

FIG. 1A is a high level block diagram of an embodiment of a memory array 199A with a chunk redundancy architecture. The memory array 199A may be two dimensional memory array or a three-dimensional memory array and may use any type of semiconductor memory technology, including, but not limited to, floating gate flash memory, charge-trap flash memory, phase-change memory, phase change memory with switch, resistive memory, ovonic memory, ferroelectric transistor random access memory (FeTRAM), nanowire technology memory, and other memory technologies. One type of memory that uses 3D techniques is stacked NAND flash, which stacks multiple floating gate or charge-trap flash memory cells in a vertical stack wired in a NAND fashion. The array 199A may be created using stacked NAND flash in some embodiments.

Figure 1B:
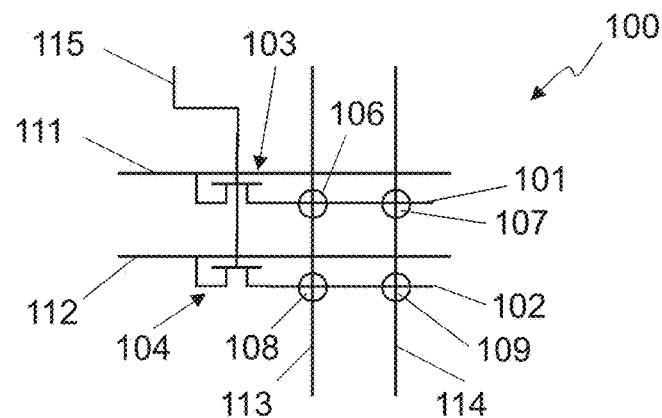
FIGS. 1B, 1C and 1D are more detailed block diagrams the embodiment of the memory array of FIG. 1A.

The memory array 199A may be arranged as chunks of memory. A chunk of memory is an array of memory having common local, or chunk, word lines and common local, or chunk, bit lines. Different embodiments of a chunk of memory are shown in FIG. 1B and FIG. 4B. The memory array 199A may be organized as an array of chunks of memory that are organized as blocks 140A-145A of chunks which may be thought of as rows of chunks, and tiles 130A-132A of chunks, which may be thought of as columns of chunks. While many embodiments may have a number of tiles and a number of addressable blocks that is a power of two for ease of address decoding, four addressable blocks with three tiles are shown in FIG. 1A for convenience. Various embodiments may have any number of tiles and any number of blocks with a single chunk of any size. In the embodiment shown in FIG. 1A, the memory array 199A has three tiles 130A-132A with four addressable blocks 140A-143A and two redundant blocks 144A-145A. Addressable block 0 140A may include chunk Ch00, chunk Ch10 and chunk Ch20. Addressable block 1 141A may include chunk Ch01, chunk Ch11 and chunk Ch21. Addressable block 2 142A may include chunk Ch02, chunk Ch12 and chunk Ch22. Addressable block 3 143A may include chunk Ch03, chunk Ch13 and chunk Ch23. Redundant block 4 144A may include chunk RD04, chunk RD14 and chunk RD24. Redundant block 5 145A may include chunk RD05, chunk RD15 and chunk RD25. Chunks Ch00, Ch01, CH02, CH03, RD04 and RD05 may be included in tile 0 130A. Chunks Ch10, Ch11, CH12, CH13, RD14 and RD15 may be included in tile 1 131A. Chunks Ch20, Ch21, CH22, CH23, RD24 and RD25 may be included in tile 2 132A. A page buffer 160A may be provided to latch the outputs of a page of data read by an access to a specific address.

The chunks of a block may share a common set of block word lines and the chunks of a tile may share a common set of tile bit lines. Addressable blocks 140A-143A may directly correspond to a range of physical addresses for the memory array 199A, while the redundant blocks 144A-145A may not directly correspond to a physical address of the memory array 199A during normal operation. So as an example, if a 1 byte wide memory has a physical address of 30 bits to provide one gigabyte (1 GB) of memory, and a block of the memory is one megabyte (1 MB) of memory, the memory would have 1024 addressable blocks of memory. The same memory may have some number of additional blocks of memory that are redundant blocks because they do not correspond to a physical address of the memory but may be remapped to be used in place of some part of the addressable blocks.

As memory geometries have become smaller, defects in the construction of the memory causing improper operation of some section of the memory have become more common. Because the number of defects in many technologies are relatively linear with area, and three dimensional technologies effectively multiply the effective area of the die by the number of layers, three dimensional memory technologies may exhibit much higher defect rates which may lead to lower than acceptable yields. In the past, redundant memory cells have been added that might allow an entire tile to be replaced by a redundant tile, or an entire block to be replaced by a redundant tile, but such architectures may not be very efficient as a defect in one chunk would cause an entire block or entire tile to be replaced.

In embodiments of the chunk redundancy architecture described herein, redundant blocks of memory may be provided in addition to the addressable blocks of the memory. But rather than replace an entire block of memory for a single defect, an individual chunk of an addressable block may be replaced by an individual chunk of a redundant block, leaving the other chunks of the redundant block free to replace other defective chunks of the addressable blocks. Chunk control circuitry 150A-152A may be included in the tiles to access chunks of the redundant blocks 144A-145A in place of chunks of the addressable blocks 140A-143A. In some embodiments the chunk control circuitry 150A-152A may be partitioned as shown, as one circuit per tile. In other embodiments, the chunk control circuitry 150A-152A may be centralized in one location for the entire memory array 199A. In yet other embodiments, the chunk control circuitry 150A-152A may be distributed throughout the memory array 199A with at least parts of the chunk control circuitry associated with individual chunks of memory, blocks of memory, or other groups of chunks of memory. Various embodiments may partition the chunk control circuitry 150A-152A in any way that may be efficient for a particular embodiment.

FIG. 1B, is a more detailed block diagram of an embodiment of a chunk of memory 100 of the memory array 199A of FIG. 1A. The chunk 100 is an extremely simplified depiction of a 2×2 bit memory array. Most embodiments may utilize much larger arrays of memory for a chunk, but the chunk 100 may be helpful in understanding embodiments. The chunk 100 includes four memory cells that are individually coupled to a chunk word line and a chunk bit line. Memory cell 106 is coupled to chunk word line 101 and chunk bit line 113 while memory cell 107 is coupled to chunk word line 101 and chunk bit line 114. Memory cell 108 is coupled to chunk word line 102 and chunk bit line 113 while memory cell 109 is coupled to chunk word line 102 and chunk bit line 114. In some embodiments, such as the embodiment of FIG. 1C, the chunk bit lines are tile bit lines although some embodiments may use circuitry to couple tile bits line to the chunk bit lines.

Chunk word line 101 is coupled to block word line 111 by a pass gate 103, which may be a field effect transistor (FET) in some embodiments. Chunk word line 102 may be coupled to block word line 112 by pass gate 104. Pass gate 103 and pass gate 104 may be controlled by chunk enable line 115, which may be driven by chunk control circuitry 150A. If the chunk enable line 115 is inactive, the pass gates 103, 104 are turned off and the memory cells 106-109 of chunk 100 are not accessible. If the chunk enable line 115 is active, pass gates 103, 104 couple the block word lines 111-112 to the chunk word lines 101-102, allowing the memory cells 106-109 of chunk 100 to be accessed.

Figure 1C:
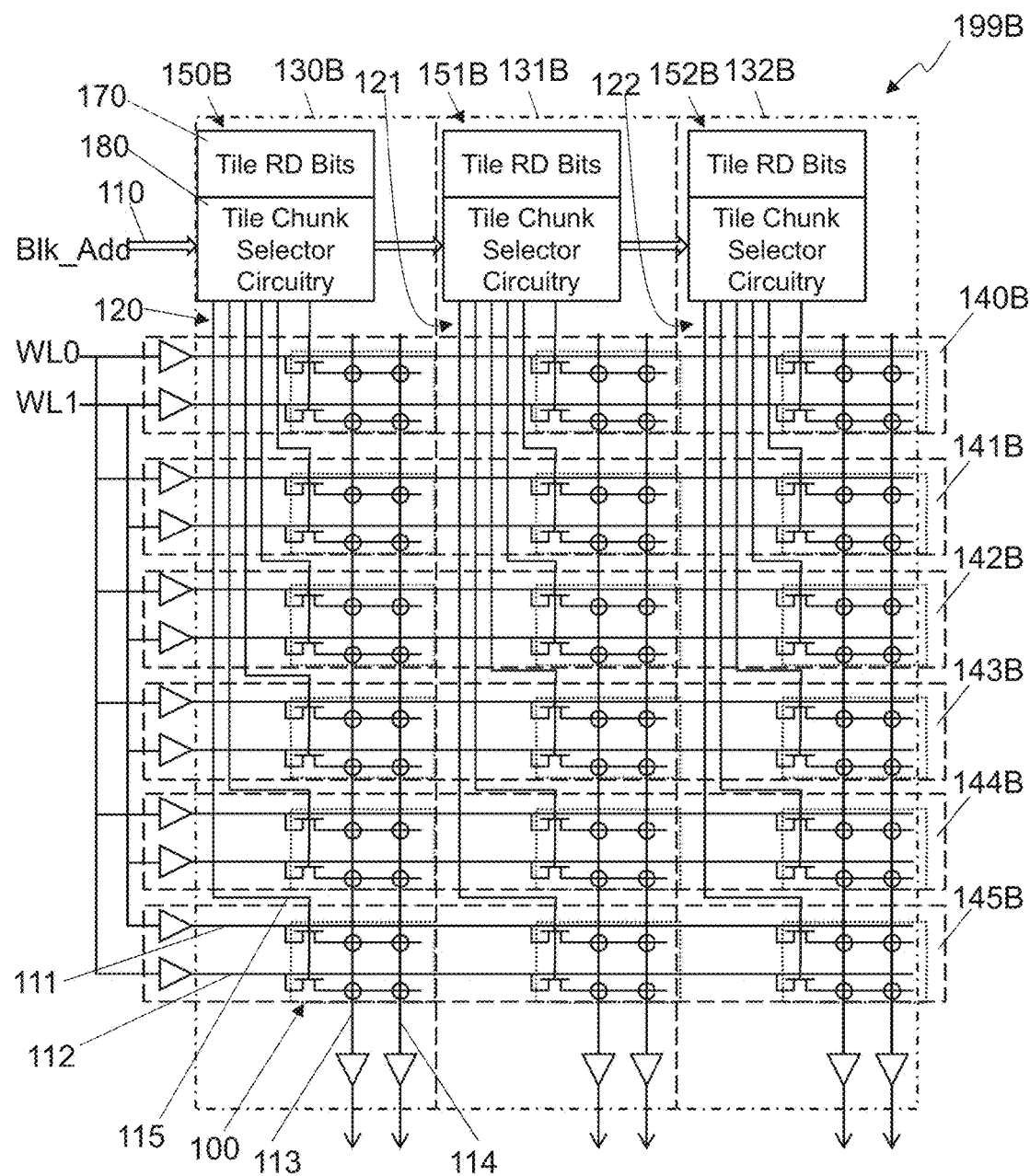

FIG. 1C is a more detailed block diagram of an embodiment of the memory array 199A of FIG. 1A. The memory array 199B may be equivalent to memory array 199A, and has 18 chunks, including chunk 100, organized into three tiles 130B-132B and six blocks 140B-145B. Chunk 100 is a part of tile 130B and block 145B. A tile may have tile bit lines, such as the tile bit lines 113, 114 of tile 130B. A block may have block word lines such as block word lines 111, 112 of tile 145B. The block word lines may be driven by buffers from global word lines WL0-WL1.

In some embodiments, a word line address may be provided to the memory array 199B and the word line address driven across the blocks 140B-145B in place of block word lines. A word line decoder may be provided within a chunk so that a chunk includes its own word line decoder. While this may result in duplicated circuitry in the form of the word line decoders, it may greatly simplify routing as many fewer lines may cross the array. For example if there are 1024 chunk word lines in a chunk, 1024 block word lines might be included. If a word line decoder is included in the chunk, only 10 block word address lines are used to generate the 1024 chunk word lines.

If the IC receives a logical address, the logical address may be decoded into a block address 110 to identify an addressable block of memory 140B-143B, and some number of global word lines, to identify a particular row of memory cells. The block address 110 may be provided to the chunk control circuitry 150B of tile 130B to generate chunk enable lines 120, chunk control circuitry 151B of tile 131B to generate chunk enable lines 121, and chunk control circuitry 152B of tile 132B to generate chunk enable lines 122. The chunk control circuits 150B-152B such as the chunk control circuitry 150B of tile 130B may be divided into two parts. Tile redundancy control cells 170 may include some number of bits of storage that may be useful to store information to remap redundant chunks of tile 130B, such as chunk 100, to addressable chunks of tile 130B. Any type of storage may be used for the tile redundancy control cells 170. Some embodiments may utilize dedicated memory cells of the same type as the array 199B that may be set during the manufacturing test process. Some embodiments may use fuse links or anti-links that may be opened or bridged by a test process. Some embodiments may use non-volatile memory cells, but other embodiments may use latches or other volatile memory technology that may be programmed during a system configuration process after a system is powered on. Tile chunk selector circuitry 180 may use information stored in the tile redundancy control cells and the block address 110 to determine which chunk enable line to enable, such as chunk enable line 115 of the chunk enable lines 120.

Figure 1D:
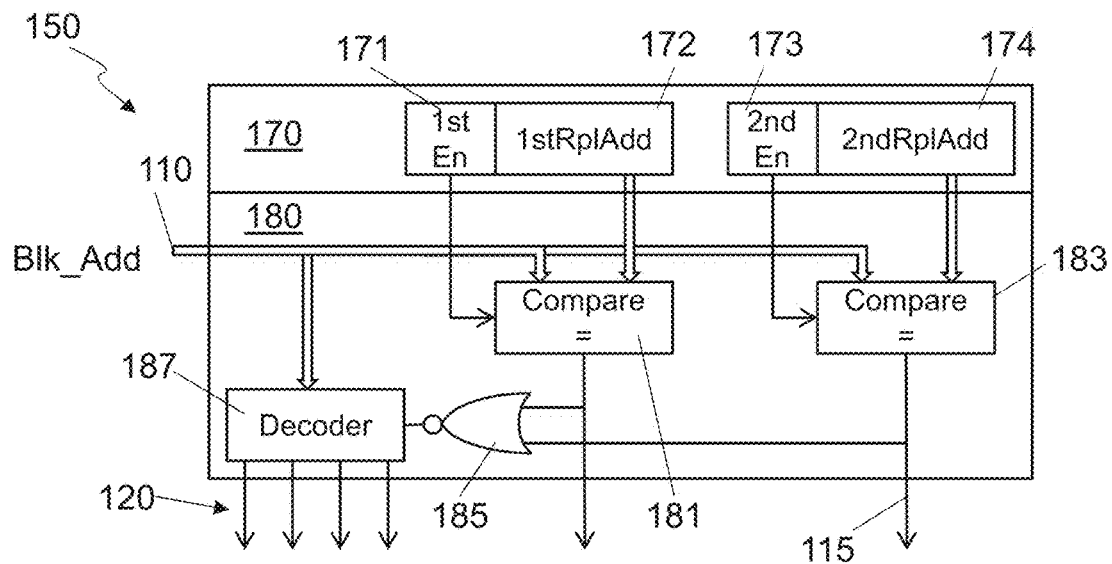

FIG. 1D is a more detailed block diagram of an embodiment of a chunk controller 150A-152A of the memory array 199A of FIG. 1A or a chunk controller 150B-152B of the memory array 199B of FIG. 1C. The tile redundancy control cells 170 may include a set of redundancy control cells that are associated with a particular redundant block of memory. The memory array 199A/B has two redundant memory blocks 144A/B, 145A/B, so two sets of redundancy control cells are included in the tile redundancy control cells 170. The first set of redundancy control cells may be useful to store a first replacement address 172 and first enable 171 that may be associated with chunk RD04 of memory array 199A or the equivalent chunk of memory array 199B. The second set of redundancy control cells may be useful to store a second replacement address 174 and second enable 173 that may be associated with chunk RD05 of memory array 199A or chunk 100 of memory array 199B. The number of bits used for the replacement addresses 172, 174 may depend on the number of addressable blocks that are included in the memory 199A/B. In the simple example shown, the memory array 199A/B has four addressable blocks, so 2 bits could be used for the replacement addresses 172, 174. In an embodiment having 256 addressable blocks, 8 bits could be used for the replacement addresses 172, 174.

Tile chunk selector circuitry 180 may compare the first replacement address 172 to the block address 110 using comparator 181 using the first enable bit 171 as an enable for the comparator 181. If the first enable bit 171 is set and the contents of the first replacement address 172 match the block address 110, the first redundant chunk RD04 of memory array 199A or the equivalent chunk of memory array 199B may be enabled for access. Tile chunk selector circuitry 180 may compare the second replacement address 174 to the block address 110 using comparator 183 using the second enable bit 173 as an enable for the comparator 183. If the second enable bit 173 is set and the contents of the second replacement address 174 match the block address 110, the first redundant chunk RD05 of memory array 199A or chunk 100 of memory array 199B may be enabled for access by asserting the chunk enable line 115

The outputs of comparator 181 and comparator 183 may be put into a NOR gate 185 to drive the enable input of decoder 187. If either of the comparator 181, 183 outputs is a one, the decoder 187 is disabled. If both the comparator 181, 183 outputs are zero, the decoder 187 may be enabled allowing the block address 110 to be decoded into the chunk enable lines 120 to enable the chunk of tile 130A/B that is in the addressed block of memory to be accessed.

Figure 2:
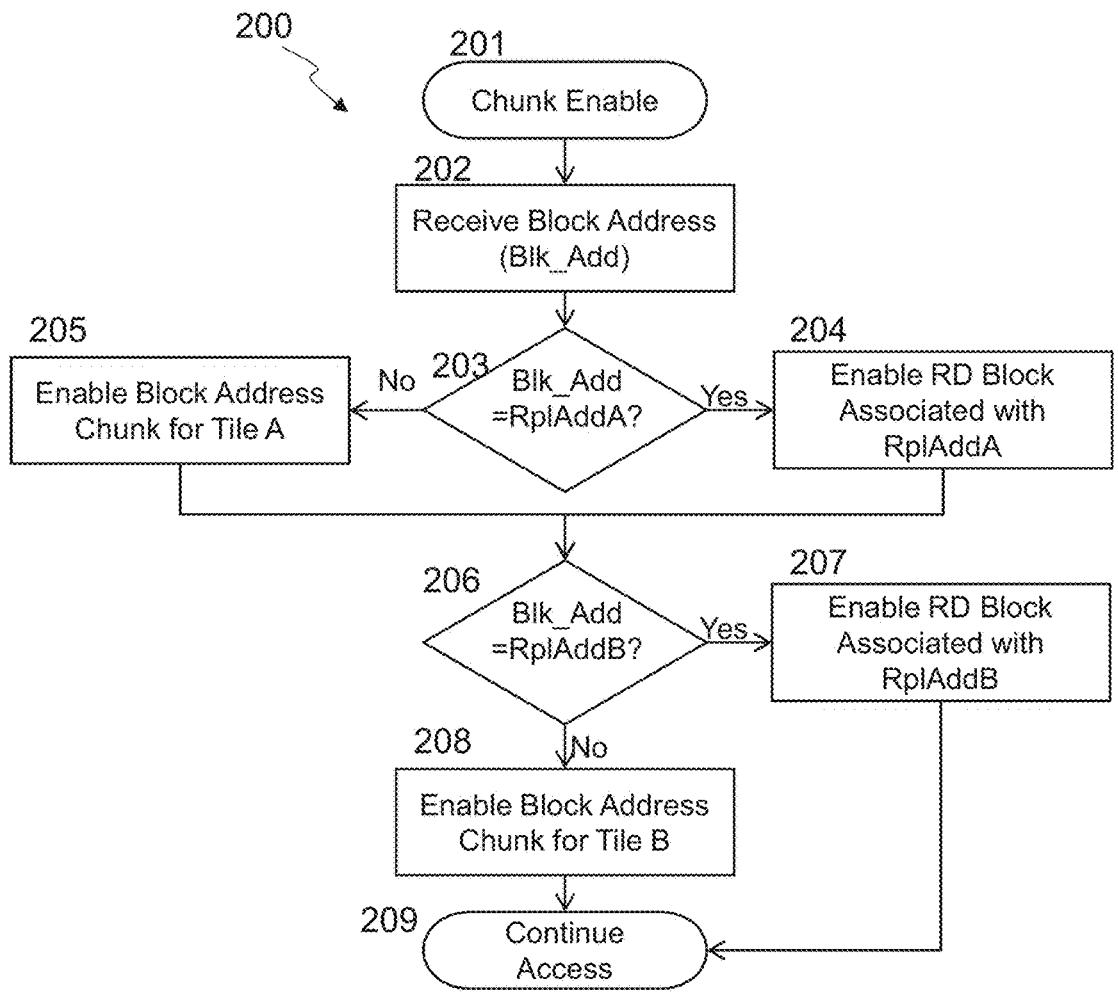
FIG. 2 is a flow chart of an embodiment for remapping redundant chunks of memory during an access.

FIG. 2 is a flow chart 200 of an embodiment for mapping redundant blocks of memory during an access. The method described by flow chart 200 may be implemented, at least in part, by the chunk control circuitry 150A/B-152A/B, in some embodiments. The method to enable chunk may begin at block 201 and continue at block 202 to receive the block address. The block address may be compared to a first replacement address that is associated with a replacement chunk of tile A at block 203. If the block address matches the first replacement address, and the first replacement address is valid, or is otherwise enabled, the associated redundant chunk of memory of tile A may be enabled at block 204. If the addresses don't match, the chunk of the addressable block of tile A indicated by the block address may be enabled for access at block 205.

The block address may be compared to a second replacement address that is associated with a replacement chunk of tile B at block 206. If the block address matches the second replacement address, and the second replacement address is valid, or is otherwise enabled, the associated redundant chunk of memory of tile B may be enabled at block 207. If the addresses don't match, the chunk of the addressable block of tile B indicated by the block address may be enabled for access at block 208 and the method may continue at block 209.

Depending on the embodiment, various blocks of flow chart 200 may be performed concurrently or serially. In some embodiments, multiple redundant blocks may be provided. In such embodiments, the method described in flow chart 200 may be repeated for the additional redundant blocks. In such embodiments the multiple versions of the flow chart 200 may operate concurrently, or in some embodiments, they may operate serially.

Figure 3A:
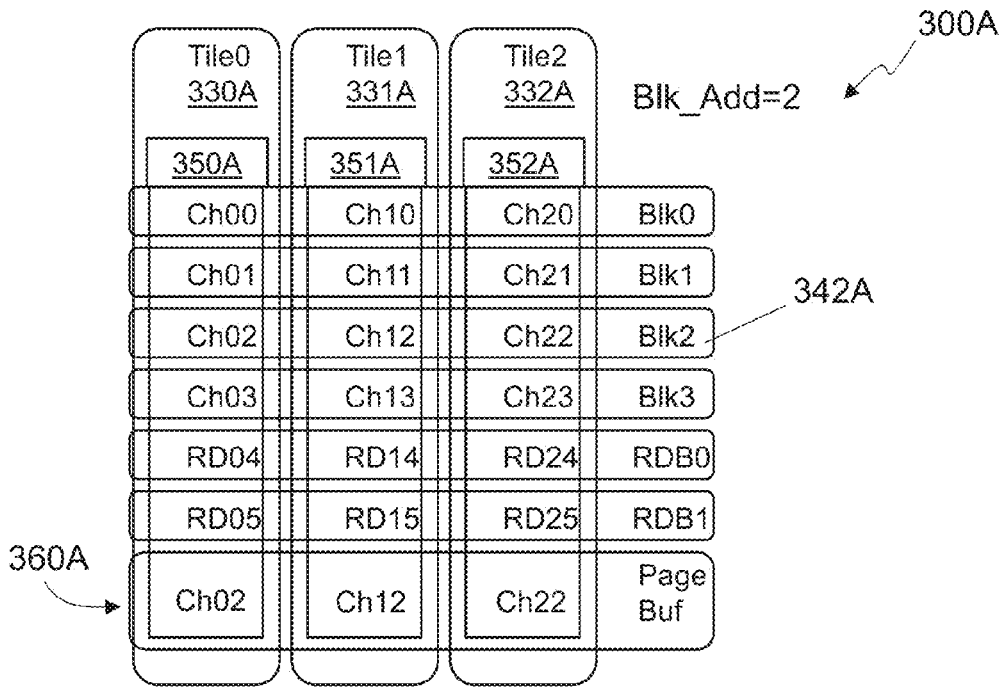
FIGS. 3A and 3B are diagrams showing how chunks of memory are accessed in embodiments.

FIG. 3A is a diagram showing how chunks of memory are accessed for an embodiment of memory array 300A. While the description may refer to accessing a chunk of memory, it may be understood that an access may only interact with a single row of memory within a chunk and may refer to either reading or writing one or more bits of the row of memory. Certain operations, such as erasing a flash memory chunk, may interact with an entire chunk or different parts of a chink of memory.

In the access shown in FIG. 3A, no chunks of the addressable blocks of memory are remapped as none of the enable bits in the redundancy control cells of the chunk control circuitry 350A-352A are set. The block address for the access shown is '2' so that Blk2 342A is being accessed. The page buffer 360A shows that chunk Ch02 of tile 330A, chunk Ch12 of tile 331A, and chunk Ch22 of tile 332A have been read into the page buffer 360A. Note that if no chunks of the addressable blocks are remapped, the chunks of the redundant blocks are inaccessible during normal operation.

Figure 3B:
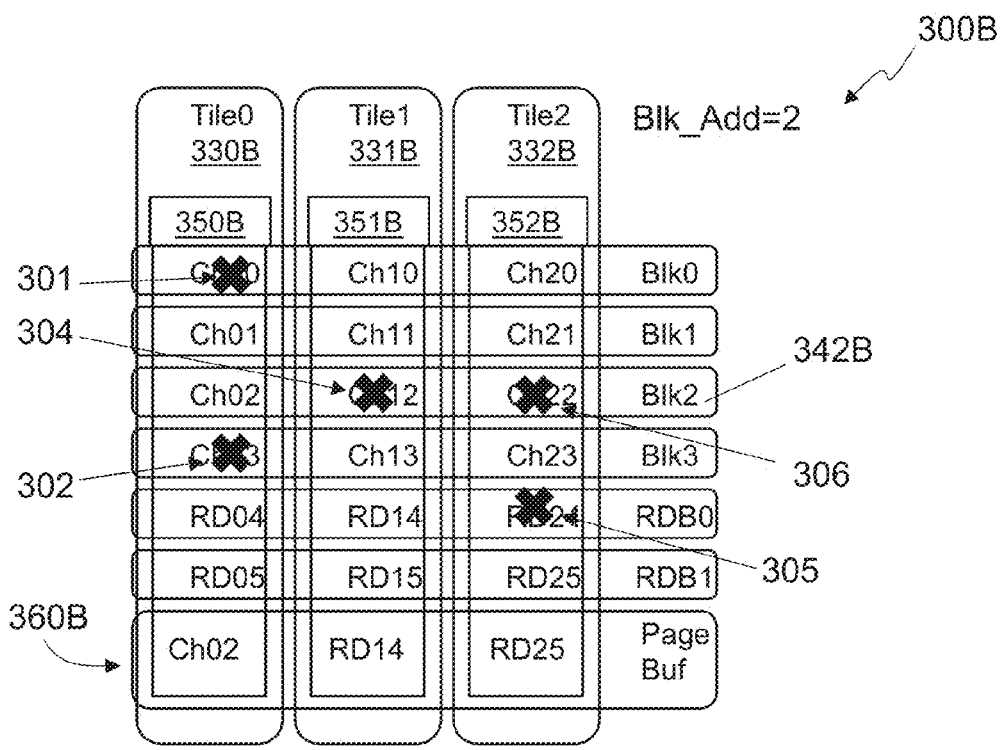

FIG. 3B is a diagram showing how chunks of memory are accessed for an embodiment of memory array 300B where several chunks of addressable blocks of memory are remapped. In the memory array 300B, chunk Ch00 has defect 301, chunk CH03 has defect 302, chunk Ch12 has defect 304, chunk RD24 has defect 305, and chunk Ch22 has defect 306. The defects may be found during a manufacturing test process in some embodiments, but other embodiments may detect the defects during a power-up self-test, or during a run-time memory test. Once the defects have been found, the redundancy control cells in chunk control circuitry 350B-352B may be programmed as appropriate to map the defective chunks to a redundant chunk of memory. Note that because the memory array 300B has two redundant blocks of memory, up to two chunks per tile may be remapped. If a third defective chunk were to be identified in a single tile, there would be no more redundant chunks to use to remap the third defective chunk, so the memory array 300B would not be able to recover from the third defective chunk in one tile.

To remap the defective chunks, redundancy control cells in the chunk control circuitry 350B-352B, which may be similar to the chunk control circuit 150 of FIG. 1D, may be programmed. The first enable bit of the redundancy control cells in chunk control circuit 350B may be set with the first replacement address set to '00' to remap an access for chunk Ch00 to chunk RD04. The second enable bit may be set with the second replacement address set to '11' to remap an access for chunk CH03 to chunk RD05. Note that if another chunk of tile 0 330B was defective, the defect could not be recovered as there are no unused redundant chunks left in tile0 330B. The first enable bit of the redundancy control cells in chunk control circuit 351B may be set with the first replacement address set to '10' to remap an access for chunk Ch12 to chunk RD14. The second enable bit may be clear as the redundant chunk RD15 is not used. The first enable bit of the redundancy control cells in chunk control circuit 352B may be clear as the redundant chunk RD24 is defective and may not be used. The second enable bit of may be set with the second replacement address set to '10' to remap an access for chunk Ch22 to chunk RD25.

So if an access to block 2 of the memory array 300 B is made, the page buffer 360B may contain chunk Ch02, chunk RD14, and chunk RD25, as shown in FIG. 3B. An access to block 0 would access chunk RD04, chunk Ch10 and chunk Ch20. An access to block 1 would access chunk Ch01, chunk Ch11, and chunk Ch21, and an access to block 3 would access chunk RD05, chunk Ch13, and chunk Ch23.

Figure 4A:
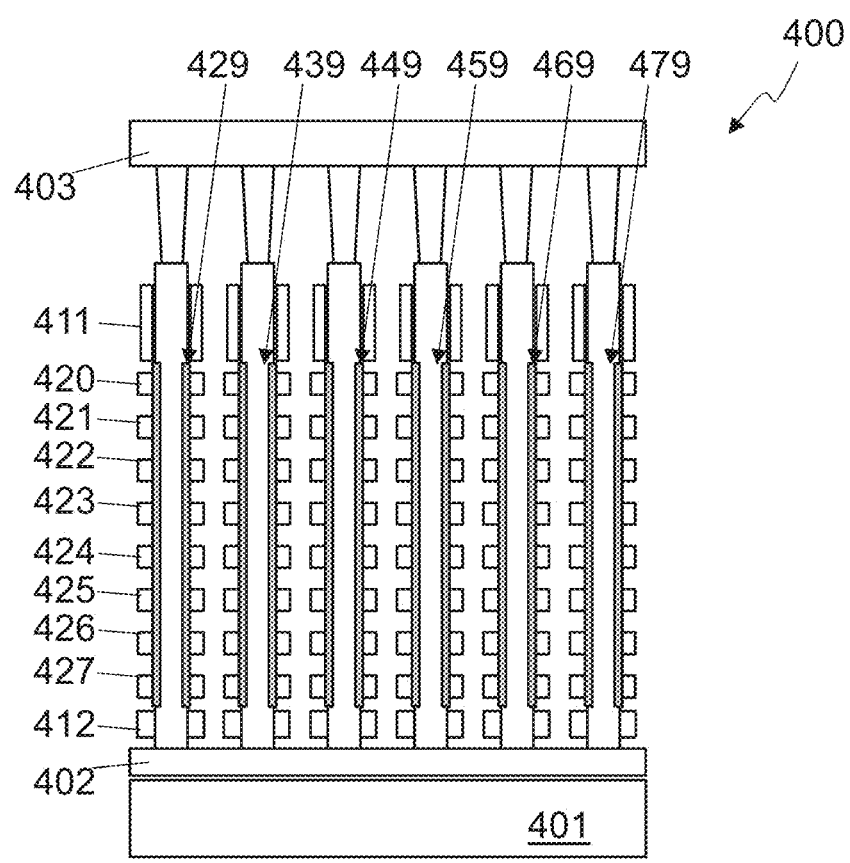
FIG. 4A is a cross-sectional side view of a three dimensional memory array with a chunk redundancy architecture.
Figure 4B:
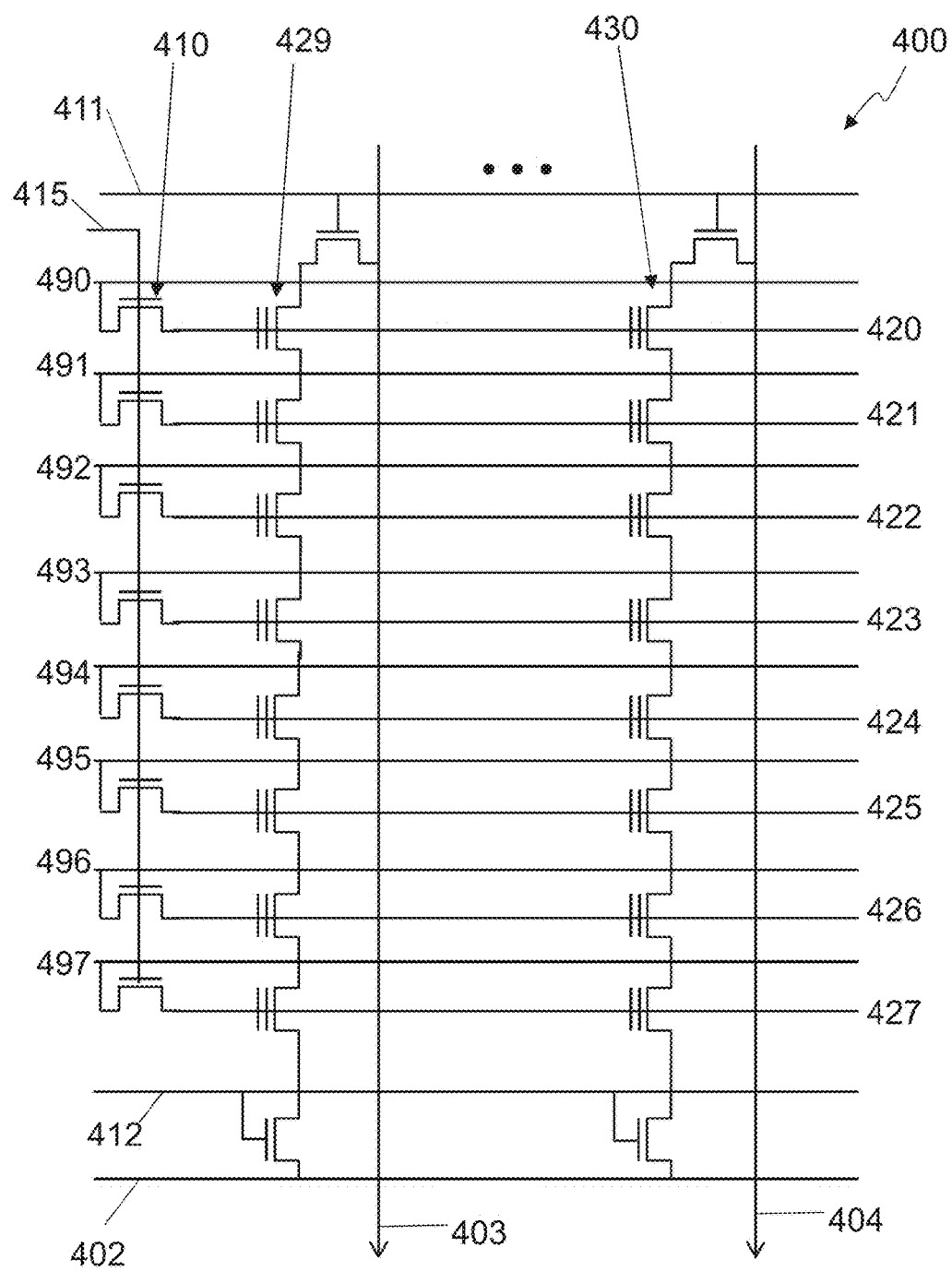
FIG. 4B is a schematic of part of the three-dimensional memory array of FIG. 4A.

FIG. 4A is a cross-sectional side view of a portion of a three dimensional memory array 400 with a chunk redundancy architecture. The memory array 400 may be built on a substrate 401 and may be implemented with stacked NAND flash memory. Six columns 429, 439, 449, 459, 469, 479 of eight flash cells are shown. One flash cell may store a single bit of information in some embodiments while other embodiments may store multiple bits of information in a single flash cell. The six columns couple to the same bit line 403 and source line 402, and may be a part of separate blocks, or may be part of a single block, depending on the embodiment.

Column 429 may be similar to the other columns 439, 449, 459, 469, 479, and include a FET controlled by control line 412 to couple the stack 429 to the source line 402 at the bottom and a FET controlled by control line 411 to couple the stack 429 to the bit line 403 at the top. The memory cells may be formed by using the chunk word lines 420-427 to create the charge storage regions in the column 429. Block word lines, not shown, may be routed over the bit line 403 and may be routed in parallel with the chunk word lines 420-427.

As can be seen in FIG. 4A, the chunk word lines 420-427 are routed in parallel with next neighbor word-lines in a chunk array, one on top of the other. For example, chunk word line 425 is routed parallel to and below chunk word line 424, and parallel to and above chunk word line 426. The insulating layers between the chunk word lines 420-427, as well as the polysilicon of the chunk word lines 420-427 and the insulating layers between the columns, may be subject to defects introduced in the manufacturing process that may cause one or more memory cells to not operate properly. In many IC manufacturing processes, many of the potential defects have a defect rate that is roughly linear with area. So because the chunk word lines 420-427 are routed in a common footprint on the substrate 401, which may be similar in size to a footprint of a single word line of a two dimensional memory array, the probability of a defect to be located in that footprint may be many times larger for the three dimensional array than for a two dimensional array of a similar die size. Dividing a long word line, such as a block word line, into multiple short chunk word lines 420-427, and replacing a defective chunk with a redundant chunk can improve the redundancy efficiency because replacing a single defect uses a single chunk of a block, while traditional redundancy architectures may use an entire block of many chunks to replace a single defect.

FIG. 4B is a schematic of part of the three-dimensional memory array 400 of FIG. 4A. Column 429 is shown as a string of floating gate FETs connected in a NAND configuration. A FET controlled by control line 412 couples the string 429 to the source line 402 and a FET controlled by control line 411 couples the string 429 to the bit line 403. The control gates of the floating gate FETs are coupled to the chunk word lines 420-427. A second string of NAND flash cells 430 is a part of the same chunk as string 429, so the second string of flash cells 430 are also coupled to the chunk word lines 420-427, but the string 430 is coupled to a different bit line 404. Referring to FIG. 4A, column 430 might be above or behind the page and may be in line with column 429. Any number of strings of NAND flash cells may be included in a single chunk and be coupled to the chunk word lines 420-427.

The chunk word lines 420-427 may be coupled to the block word lines 490-497 by pass gates 410. The pass gates 410 may be controlled by the chunk enable line 415. The block word lines 490-497 may continue to other chunks in the same block, and the bit lines 403, 404 may continue to other chunks in the same tile.

In at least one embodiment, at least 64 blocks of addressable memory, having 'n' chunks of memory respectively, are included in the memory array, along with at least 4 blocks of redundant memory having 'n' chunks of memory respectively, where 'n' is at least 4. The memory array is organized into 'n' tiles. In such an embodiment, the control circuitry can remap at least 16 chunks of the at least 64 blocks of addressable memory, including at least 4 chunks in a given tile.

As a further example, a memory array may include 8 gigabit (Gb)×8 bits of addressable memory with a 33 bit address input. The memory array may be made of 1024× 1024 chunks of memory organized into 256 blocks and 256 tiles so that 8 bits of the address are used to generate a block address, 10 bits of the address are used to generate the global word lines, and 15 bits are used to select which bits of the block are being accessed. The memory array may include 8 redundant blocks of memory, adding about 3% of additional area to the memory array. The embodiment may be able to remap up to 2048 chunks of memory of the memory array and may be able to remap up to 8 chunks of a given tile. Chunk control circuitry for a tile may include 8 sets of redundancy control cells having storage for an 8 bit replacement block address and an enable bit, for a total of 72 redundancy control cells per tile.

Figure 5:
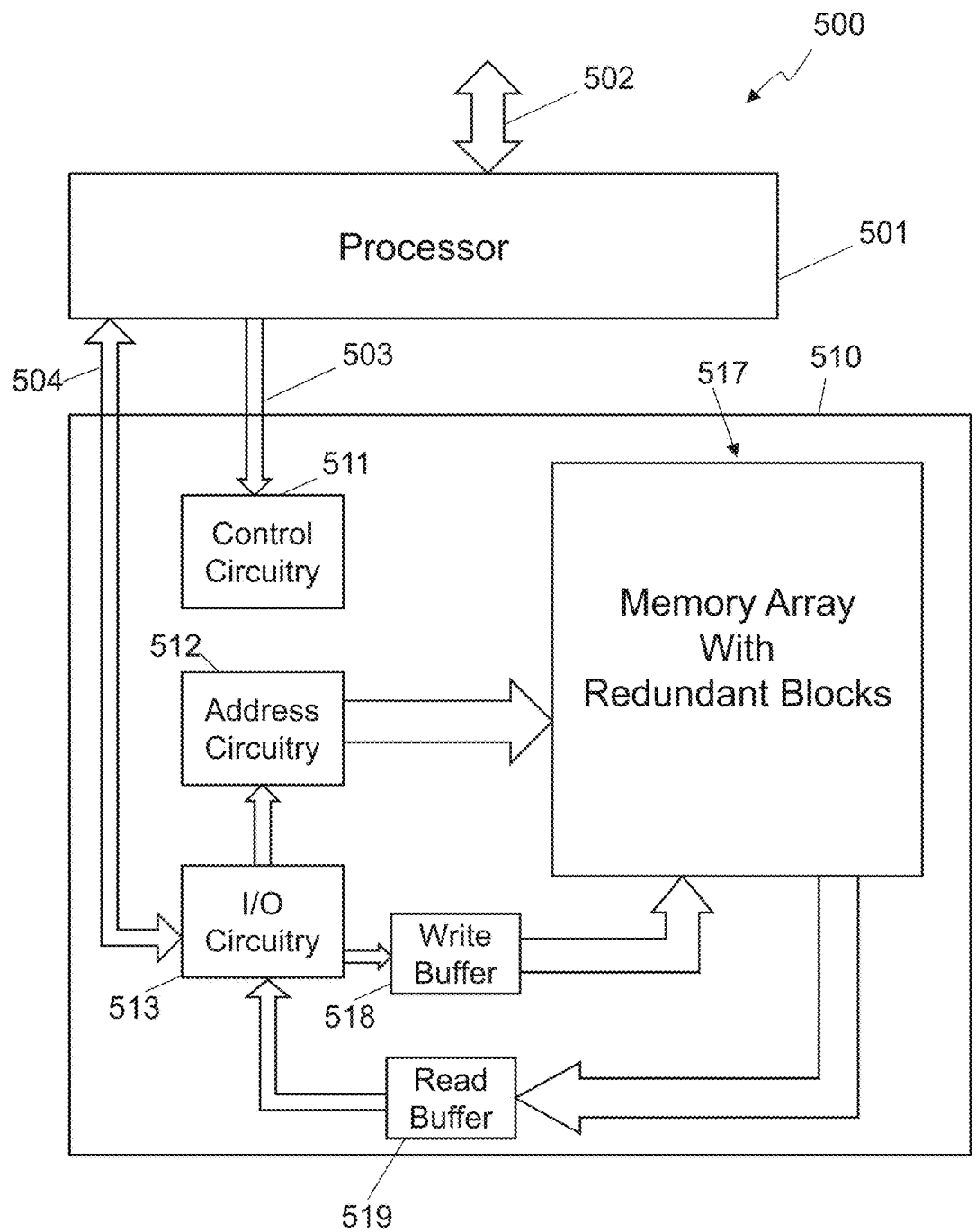
FIG. 5 is a block diagram of an embodiment of an electronic system using a chunk redundancy architecture.

FIG. 5 is a block diagram of an embodiment of an electronic system 500 that includes an IC, such as a memory device 510 having a memory array 517 with a chunk redundancy architecture such as described earlier. A processor 501 is coupled to the memory device 510 with control/ address lines 503 and data lines 504. In some embodiments, data and control may utilize the same lines. The processor 501 may be an external microprocessor, microcontroller, or some other type of external controlling circuitry. In some embodiments, the processor 501 may be integrated in the same package or even on the same die as the memory device 510. In some embodiments, the processor 501 may be integrated with the control circuitry 511, allowing some of the same circuitry to be used for both functions. The processor 501 may have external memory, such as random access memory (RAM) and read only memory (ROM), used for program storage and intermediate data or it may have internal RAM or ROM. In some embodiments, the processor may use the memory device 510 for program or data storage. A program running on the processor 501 may implement many different functions including, but not limited to, an operating system, a file system, defective chunk remapping, and error management.

In some embodiments an external connection 502 is provided. The external connection 502 is coupled to the processor 501 and allows the processor 501 to communicate to external devices. If the electronic system 500 is a storage system, the external connection 502 may be used to provide an external device with non-volatile storage. The electronic system 500 may be a solid-state drive (SSD), a USB thumb drive, or any other type of storage system. The external connection 502 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If the electronic system 500 is a computing system, such as a mobile telephone, a tablet, a notebook computer, a set-top box, or some other type of computing system, the external connection 502 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)-Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 510 may include an array 517 of memory cells. The memory cells may be made of chunks of memory organized into columns, or tiles, of chunks and rows, or blocks, of chunks. Redundant blocks of chunks are provided, allowing the redundant chunks of a tile to be used to replace defective chunks within that tile. The chunks of memory may also be arranged as stacks of three dimensional memory cells, such as stacked NAND strings, Address lines and control lines 503 may be received and decoded by control circuitry 511, I/O circuitry 513 and address circuitry 512 which may provide control to the memory array 517. I/O circuitry 513 may couple to the data lines 504 allowing data to be received from and sent to the processor 501. Data read from the memory array 517 may be temporarily stored in read buffers 519. Data to be written to the memory array 517 may be temporarily stored in write buffers 518 before being transferred to the memory array 517.

The system illustrated in FIG. 5 has been simplified to facilitate a basic understanding of the features of the memory. Many different embodiments are possible including using a single processor 502 to control a plurality of memory devices 510 to provide for more storage space. Additional functions, such as a video graphics controller driving a display, and other devices for human oriented I/O may be included in some embodiments.

Figure 6:
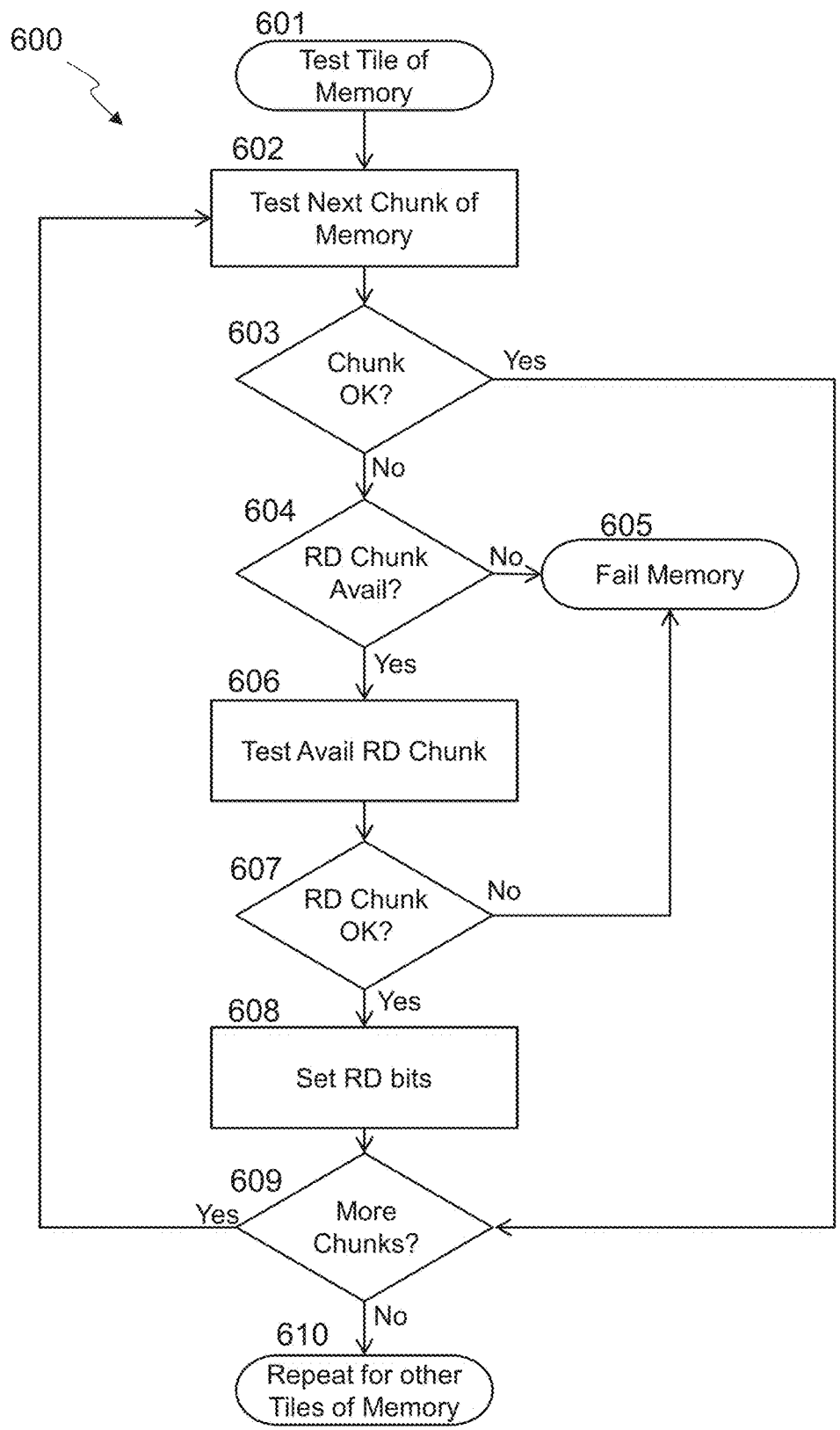
FIG. 6 is a flow chart of an embodiment of a method to test an IC.

FIG. 6 is a flow chart 600 of an embodiment of a method to test an IC including a memory array with chunk redundancy architecture such as those shown in FIGS. 1A-D. Although the method may be useful for a variety of embodiments, the drawings of FIGS. 1A-D may be instructive in understanding the method and are used for illustrative purposes. Testing a tile of memory may begin at block 601. The method may be implemented using any combination of hardware circuitry, testing machines, dedicated computer systems, general purpose computers, firmware, software or any other way of implementing the method. Aspects of embodiments may take the form of a computer program product embodied in a computer readable medium or multiple computer readable media, having computer readable program code, or instructions, stored thereon. Any combination of one or more computer readable storage media may be utilized. A computer readable storage medium may be embodied as, for example, an electronic, magnetic, optical, electromagnetic, or semiconductor system, apparatus, or device, or other storage devices known to those of ordinary skill in the art, or any suitable combination of computer readable storage mediums. In the context of this document, a computer readable storage medium may be any tangible medium that can contain, or store a program and/or data for use by or in connection with an instruction execution system, apparatus, or device.

A chunk of memory within a first tile may be tested at block 602. In some embodiments, multiple chunks of memory of different tiles but in a common block of memory may be tested at the same time. The chunk of memory may be tested using any memory test known in the art and may be tuned to find errors based on the technology used for the memory. If the chunk of memory is OK at block 603, a check to see if more chunks are yet to be tested at block 609. If the chunk of memory has a defect, a redundant chunk of memory may be used to replace the defective chunk. Some embodiments may check to see if a redundant chunk of memory is available at block 604. A count, a list, or some other method may be used to keep track of the redundant chunks of the tile that are still available, or have not yet used to remap a chunk of addressable memory, depending on the number of redundant blocks of memory provided in the embodiment. If no more redundant chunks are available in the tile, the IC containing the memory array may be failed at block 605.

If a chunk of redundant memory is available to replace the defective chunk, some embodiments may test the redundant chunk of memory at block 606 before using it to replace the defective chunk. The same memory test or a different memory test may be used as was used in block 602. In some embodiments, special support may be provided by the IC to allow the redundant chunk of memory to be tested without setting the replacement bits, such as special probe points or special modes of operation accessible during test. Other embodiments may simply program the redundancy control cells appropriately and test the redundant chunk by providing the address for the defective chunk and replacing the defective chunk with the redundant chunk during the memory test. If the redundant chunk is defective at block 607, some embodiments may fail the IC at block 605. Other embodiments may check to see if another redundant chunk is available and attempt to use the another redundant chunk to replace the defective chunk.

If the redundant chunk of memory is OK at block 607, a first set of redundancy control cells are loaded at block 608. Loading may refer to storing information into a cell and may alternatively be referred to a setting, clearing, programming, erasing, or filling the cell with information. The first set of redundancy control cells may be associated with the redundant chunk of tile 1 and may be used to signify that the defective chunk should be replaced. In some embodiments, some of the first set of redundancy control cells may be loaded to identify the block address of the defective chunk of memory and an enable bit may be set to enable replacement of the defective chunk. At block 609, a check is made to see if there are more chunks of the tile to test. If there are, the next chunk of memory of tile 1 is tested at block 602 and the method repeated for the next block of memory.

The method shown in flowchart 600 may also be used on a second tile of memory so that a second chunk of memory of a second tile of the memory circuit is tested at block 602 and found to be defective at block 603. A check may be made to see if a redundant chunk is still available for the second tile and if so, the redundant chunk may be tested at block 606 and found to be OK at block 607. A second set of redundancy control cells to identify a block address of the second chunk of memory in the second tile may be loaded at block 608. The second set of redundancy control cells may be associated with the redundant chunk being used to replace the defective chunk of the second tile. Some of the second set of redundancy control cells may be loaded to identify the block address of the defective chunk of memory of the second tile and an enable bit may be set to enable replacement of the defective chunk. In some embodiments, the chunks of a multiple tiles that are in the same block may be tested at the same time. Two chunks of the same redundant block but different tiles may have their associated sets of redundancy control cells loaded so that two blocks with different block addresses may be replaced by the redundant chunks.

In some embodiments, more than one redundant block of memory may be provided so that there is more than one redundant chunk in a tile. In such embodiments, another chunk of memory of the first tile of the memory circuit may be tested after testing a first chunk of memory. If the first chunk of memory was not defective and the another chunk of memory is defective, the first set of redundancy control cells, associated with a first chunk of redundant memory of the tile, may be loaded to identify the block address of the another chunk of memory. If both the first chunk of memory and the another chunk of memory are defective the first set of redundancy control cells, associated with a first chunk of redundant memory of the tile, may be loaded to identify the block address of the first chunk of memory, and the second set of redundancy control cells, associated with a second chunk of redundant memory of the tile, may be loaded to identify the block address of the another chunk of memory.

The flowcharts 200, 600 help to illustrate the architecture, functionality, and operation of possible implementations of various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the flowcharts 200, 600, and/or combinations of blocks, can be implemented by special purpose hardware-based systems that perform the specified functions or acts, or combinations of special purpose hardware and computer instructions.

Examples of various embodiments are described in the following paragraphs:

An example integrated circuit includes two or more addressable blocks of memory, and at least one redundant block of memory. Blocks of memory respectively include at least a first chunk of memory of a first tile and a second chunk of memory of a second tile. The example IC also includes redundancy control cells and control circuitry. The control circuitry can access a first redundant chunk of the at least one redundant block of memory in place of a first remapped chunk of one of the two or more addressable blocks of memory, and a second redundant chunk of the at least one redundant block of memory in place of a second remapped chunk of one of the two or more addressable blocks of memory, based on information stored in the redundancy control cells. In some example ICs the first chunk of a given block and the second chunk of the given block may be concurrently accessed. In some example ICs a chunk of memory may include a three-dimensional array of memory cells. In some example ICs the redundancy control cells may include one or more cells to store a first block address, a cell to store a first enable bit to enable remapping an access of the first remapped chunk indicated by the first block address to the first redundant chunk, one or more cells to store a second block address, and a cell to store a second enable bit to enable remapping an access of the second remapped chunk indicated by the second block address to the second redundant chunk. In some example ICs the blocks of memory respectively may also include block word address lines. In some example ICs, chunks of memory respectively may include a chunk enable line coupled to the control circuitry, a word line decoder, coupled to the block word address lines and the chunk enable line, chunk word lines, coupled to the word line decoder, chunk bit lines coupled to tile bit lines, and an array of memory cells respectively coupled to one of the chunk word lines and one of the chunk bit lines. In some example ICs the blocks of memory respectively may also include block word lines coupled to chunk word lines of the first and second chunks of memory by control gates, first chunks of the two or more addressable blocks of memory and the first redundant chunk are coupled to a first set of bit lines, second chunks of the two or more addressable blocks of memory and the second redundant chunk are coupled to a second set of bit lines. In some example ICs the control gates are controlled by the control circuitry. In some example ICs the control gates isolate the first remapped chunk and the second remapped chunk from the accessible data area. In some example ICs chunks of memory respectively include an array of memory cells, wherein a column of cells of the array are coupled to a chunk bit line and a row of cells of the array are coupled to a chunk word line. In some example ICs a cell of the memory array may be placed at an intersection of the chunk bit line and the chunk word line. In some example ICs the two or more addressable blocks of memory include at least 64 blocks of addressable memory organized into 'n' tiles, the at least 64 blocks of addressable memory having 'n' chunks of memory respectively, wherein 'n' is at least 4, and the at least one redundant block of memory comprises at least 4 blocks of redundant memory having 'n' chunks of memory respectively. In some example ICs the control circuitry can remap at least 16 chunks of the at least 64 blocks of addressable memory, including at least 4 chunks in one tile, with chunks from the at least 4 blocks of redundant memory. Any combination of the examples of this paragraph may be used in embodiments.

An example method of accessing memory includes receiving a block address to indicate an addressed block of the memory, accessing either a first chunk of memory in the addressed block of the memory or a first chunk of memory in a redundant block of the memory based on information stored in redundancy control cells, and accessing either a second chunk of memory in the addressed block of the memory or a second chunk of memory in the redundant block of the memory based on information stored in the redundancy control cells. In some example methods of accessing a memory the memory includes a three dimensional array of memory. Some example methods also include comparing the block address to a first address stored in the redundancy control cells and accessing the first chunk of memory in the redundant block of memory if the addresses match and a first enable bit stored in the redundancy control cells is set, and comparing the block address to a second address stored in the redundancy control cells and accessing the second chunk of memory in the redundant block of memory if the addresses match and a second enable bit stored in the redundancy control cells is set. Any combination of the examples of this paragraph may be used in embodiments.

An example IC includes two or more addressable blocks of memory and at least one redundant block of memory. In the example IC, blocks of memory respectively include at least a first chunk of memory and a second chunk of memory. The example IC also includes means for receiving a block address to indicate an addressed block of the memory, means for accessing either a first chunk in the addressed block of the two or more addressable blocks of memory, or a first chunk in the at least one redundant block of memory, based on information stored in redundancy control cells, and means for accessing either a second chunk in the addressed block of the two or more addressable blocks of memory, or a second chunk in the at least one redundant block of memory, based on information stored in redundancy control cells. In some example ICs the two or more addressable blocks of memory and the at least one redundant block of memory may include three dimensional arrays of memory. Some example ICs may include means for comparing the block address to a first address and a second address stored in the redundancy control cells, means for accessing the first chunk in the at least one redundant block of memory if the block address matches the first address and a first enable bit stored in the redundancy control cells is set, and means for accessing the second chunk in the at least one redundant block of memory if the block address matches the second address and a second enable bit stored in the redundancy control cells is set. Any combination of the examples of this paragraph may be used in embodiments.

An example electronic system may include a processor to generate memory control commands, and at least one memory, coupled to the processor, to respond to the memory control commands. In the example electronic system, the at least one memory includes two or more addressable blocks of memory, and at least one redundant block of memory. In the example electronic system, blocks of memory respectively include at least a first chunk of memory of a first tile and a second chunk of memory of a second tile. In the example electronic system, the at least one memory also includes redundancy control cells, and control circuitry to access a first redundant chunk of the at least one redundant block of memory in place of a first remapped chunk of one of the two or more addressable blocks of memory, and a second redundant chunk of the at least one redundant block of memory in place of a second remapped chunk of one of the two or more addressable blocks of memory, based on information stored in the redundancy control cells. In some example electronic systems, a chunk of memory may include a three-dimensional array of memory cells. In some example electronic systems, the redundancy control cells may include one or more cells to store a first block address, a cell to store a first enable bit to enable remapping an access of the first remapped chunk indicated by the first block address to the first redundant chunk, one or more cells to store a second block address, and a cell to store a second enable bit to enable remapping an access of the second remapped chunk indicated by the second block address to the second redundant chunk. In some example electronic systems, the blocks of memory further respectively may include block word address lines. In some example electronic systems, chunks of memory respectively include a chunk enable line coupled to the control circuitry, a word line decoder, coupled to the block word address lines and the chunk enable line, chunk word lines, coupled to the word line decoder, chunk bit lines coupled to tile bit lines, and an array of memory cells respectively coupled to one of the chunk word lines and one of the chunk bit lines. In some example electronic systems, the blocks of memory respectively also include block word lines coupled to chunk word lines of the first and second chunks of memory by control gates, first chunks of the two or more addressable blocks of memory and the first redundant chunk are coupled to a first set of bit lines, second chunks of the two or more addressable blocks of memory and the second redundant chunk are coupled to a second set of bit lines. In some example electronic systems, the control gates are controlled by the control circuitry. In some example electronic systems, chunks of memory respectively comprise an array of memory cells, where a column of the array is coupled to a chunk bit line and a row of the array is coupled to a chunk word line. In some example electronic systems, the two or more addressable blocks of memory may include at least 64 blocks of addressable memory organized into 'n' tiles, the at least 64 blocks of addressable memory having 'n' chunks of memory respectively, wherein 'n' is at least 4, and the at least one redundant block of memory comprises at least 4 blocks of redundant memory having 'n' chunks of memory respectively. In some example electronic systems, the control circuitry can remap at least 16 chunks of the at least 64 blocks of addressable memory, including at least 4 chunks in one tile, with chunks from the at least 4 blocks of redundant memory. Any combination of the examples of this paragraph may be used in embodiments.

An example method to test a memory circuit may include testing a first chunk of memory of a first tile of the memory circuit, loading a first set of redundancy control cells to identify a block address of the first chunk of memory if the first chunk of memory is defective, testing a second chunk of memory of a second tile of the memory circuit, and loading a second set of redundancy control cells to identify a block address of the second chunk of memory if the second chunk of memory is defective. Some example methods may also include testing a redundant chunk of memory associated with the first set of redundancy control cells. Some example methods also include testing another chunk of memory of the first tile of the memory circuit after testing the first chunk of memory, loading the first set of redundancy control cells to identify a block address of the another chunk of memory if the first chunk of memory was not defective and the another chunk of memory is defective, and loading another set of redundancy control cells to identify the block address of the another chunk of memory if the first chunk of memory was defective and the another chunk of memory is defective. In some example methods, the first set of redundancy control cells is associated with a first redundant chunk of memory of the first tile of the memory circuit and the another set of redundancy control cells is associated with another redundant chunk of memory of the first tile of the memory circuit. Some example methods may also include testing another chunk of memory of the first tile of the memory circuit after testing the first chunk of memory, and failing the memory circuit if no redundant chunks of the first tile of memory are available. Any combination of the examples of this paragraph may be used in embodiments.

An example computer program product may include at least one computer readable medium having instructions stored therein, the instructions, if executed on a machine, cause the machine to test a first chunk of memory of a first tile of the memory circuit, load a first set of redundancy control cells to identify a block address of the first chunk of memory if the first chunk of memory is defective, test a second chunk of memory of a second tile of the memory circuit, and load a second set of redundancy control cells to identify a block address of the second chunk of memory if the second chunk of memory is defective. Some example computer programs may include instructions that, if executed on a machine, cause the machine to test a redundant chunk of memory associated with the first set of redundancy control cells. Some example computer programs may include instructions that, if executed on a machine, cause the machine to test another chunk of memory of the first tile of the memory circuit after testing the first chunk of memory, load the first set of redundancy control cells to identify a block address of the another chunk of memory if the first chunk of memory was not defective and the another chunk of memory is defective, and load another set of redundancy control cells to identify the block address of the another chunk of memory if the first chunk of memory was defective and the another chunk of memory is defective. In some example computer programs the first set of redundancy control cells is associated with a first redundant chunk of memory of the first tile of the memory circuit and the another set of redundancy control cells is associated with another redundant chunk of memory of the first tile of the memory circuit. Some example computer programs may include instructions that, if executed on a machine, cause the machine to test another chunk of memory of the first tile of the memory circuit after testing the first chunk of memory, and fail the memory circuit if no redundant chunks of the first tile of memory are available. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. An integrated circuit comprising:
   two or more addressable blocks of memory, and at least one redundant block of memory, the two or more addressable blocks of memory respectively include at least a first chunk of memory cells of a first tile and a second chunk of memory cells of a second tile;
   redundancy control cells; and
   control circuitry to access a first redundant chunk of memory cells of the at least one redundant block of memory in place of a first remapped chunk of memory cells of the two or more addressable blocks of memory, and a second redundant chunk of memory cells of the at least one redundant block of memory in place of a second remapped chunk of memory cells of the two or more addressable blocks of memory, based on information stored in the redundancy control cells, wherein the two or more addressable blocks of memory and the at least one redundant block of memory further respectively include block word lines, and
   chunks of memory cells respectively include:
      a chunk enable line coupled to the control circuitry;
      a word line decoder coupled to the block word lines and the chunk enable line;
      chunk word lines coupled to the word line decoder;
      chunk bit lines coupled to tile bit lines; and
      an array of memory cells respectively coupled to one of the chunk word lines and one of the chunk bit lines.

2. The integrated circuit of claim 1, wherein a chunk of memory cells comprises a three-dimensional array of memory cells.

3. The integrated circuit of claim 1, wherein the redundancy control cells comprise:
   one or more cells to store a first block address;
   a cell to store a first enable bit to enable remapping an access of the first remapped chunk of memory cells indicated by the first block address to the first redundant chunk of memory cells;
   one or more cells to store a second block address; and
   a cell to store a second enable bit to enable remapping an access of the second remapped chunk of memory cells indicated by the second block address to the second redundant chunk of memory cells.

4. The integrated circuit of claim 1, wherein a column of memory cells included in the array of memory cells is coupled to one of the chunk bit lines and a row of memory cells included in the array of memory cells is coupled to one of the chunk word lines.

5. The integrated circuit of claim 4, wherein a memory cell of the array of memory cells is placed at an intersection of one of the chunk bit lines and one of the chunk word lines.

6. The integrated circuit of claim 1, wherein the first chunk of memory cells of a given addressable block of memory and the second chunk of memory cells of the given addressable block of memory are concurrently accessed.

7. The integrated circuit of claim 1, wherein
   the block word lines of the two or more addressable blocks of memory and the at least one redundant block of memory are coupled to chunk word lines of the first and second chunks of memory cells by respective control gates;
   first chunks of memory cells of the two or more addressable blocks of memory and the first redundant chunk of memory cells are coupled to a first set of chunk bit lines;
   second chunks of memory cells of the two or more addressable blocks of memory and the second redundant chunk of memory cells are coupled to a second set of chunk bit lines; and
   the control gates are controlled by the control circuitry.

8. The integrated circuit of claim 7, wherein the control gates isolate the first remapped chunk of memory cells and the second remapped chunk of memory cells from the chunks of memory of the two or more addressable blocks of memory.

9. The integrated circuit of claim 1, wherein
   the two or more addressable blocks of memory comprise at least 64 addressable blocks of memory organized into 'n' tiles, the at least 64 addressable blocks of memory having 'n' chunks of memory cells respectively, wherein 'n' is at least 4;

the at least one redundant block of memory comprises at least 4 redundant blocks of memory having 'n' chunks of memory cells respectively; and the control circuitry can remap at least 16 chunks of memory cells of the at least 64 addressable blocks of memory, including a remap of at least 4 chunks of memory cells of a single tile from among the 'n' tiles, with chunks of memory cells from the at least 4 redundant blocks of memory.

10. An electronic system comprising:

a processor to generate memory control commands; and at least one memory, coupled to the processor, to respond to the memory control commands, the at least one memory comprising:

two or more addressable blocks of memory, and at least one redundant block of memory, the two or more addressable blocks of memory respectively include at least a first chunk of memory cells of a first tile and a second chunk of memory cells of a second tile;

redundancy control cells; and control circuitry to access a first redundant chunk of memory cells of the at least one redundant block of memory in place of a first remapped chunk of memory cells of the two or more addressable blocks of memory, and a second redundant chunk of memory cells of the at least one redundant block of memory in place of a second remapped chunk of memory cells of the two or more addressable blocks of memory, based on information stored in the redundancy control cells, wherein the two or more addressable blocks of memory and the at least one redundant block of memory further respectively include block word lines, and chunks of memory cells respectively include:

a chunk enable line coupled to the control circuitry;

a word line decoder coupled to the block word lines and the chunk enable line;

chunk word lines coupled to the word line decoder;

chunk bit lines coupled to tile bit lines; and an array of memory cells respectively coupled to one of the chunk word lines and one of the chunk bit lines.

11. The electronic system of claim 10, wherein a chunk of memory cells comprises a three-dimensional array of memory cells.

12. The electronic system of claim 10, wherein the redundancy control cells comprise:

one or more cells to store a first block address;

a cell to store a first enable bit to enable remapping an access of the first remapped chunk of memory cells indicated by the first block address to the first redundant chunk of memory cells;

one or more cells to store a second block address; and a cell to store a second enable bit to enable remapping an access of the second remapped chunk of memory cells indicated by the second block address to the second redundant chunk of memory cells.

13. The electronic system of claim 10, wherein a column of memory cells included in the array of memory cells is coupled to one of the chunk bit lines and a row of memory cells included in the array of memory cells is coupled to one of the chunk word lines.

14. The electronic system of claim 10, wherein the block word lines of the two or more addressable blocks of memory and the at least one redundant block of memory are coupled to chunk word lines of the first and second chunks of memory cells by respective control gates;

first chunks of memory cells of the two or more addressable blocks of memory and the first redundant chunk of memory cells are coupled to a first set of chunk bit lines;

second chunks of memory cells of the two or more addressable blocks of memory and the second redundant chunk of memory cells are coupled to a second set of chunk bit lines; and the control gates are controlled by the control circuitry.

15. The electronic system of claim 14, wherein the control gates isolate the first remapped chunk of memory cells and the second remapped chunk of memory cells from the chunks of memory of the two or more addressable blocks of memory.

16. The electronic system of claim 10, wherein the two or more addressable blocks of memory comprise at least 64 addressable blocks of memory organized into 'n' tiles, the at least 64 addressable blocks of memory having 'n' chunks of memory cells respectively, wherein 'n' is at least 4;

the at least one redundant block of memory comprises at least 4 redundant blocks of memory having 'n' chunks of memory cells respectively; and the control circuitry can remap at least 16 chunks of memory cells of the at least 64 addressable blocks of memory, including a remap of at least 4 chunks of memory cells of a single tile from among the 'n' tiles, with chunks of memory cells from the at least 4 redundant blocks of memory.

\* \* \* \* \*